United States Patent [19]

Snowden, Jr. et al.

[11] Patent Number: 4,666,547
[45] Date of Patent: May 19, 1987

[54] ELECTRICALLY CONDUCTIVE RESINOUS BOND AND METHOD OF MANUFACTURE

[76] Inventors: Thomas M. Snowden, Jr., P.O. Box 4231, Clearwater, Fla. 33518; Barbara J. Wells, 865 N. Village Dr., Apt. 101B, St. Petersburg, Fla. 33702

[21] Appl. No.: 718,060

[22] Filed: Mar. 29, 1985

[51] Int. Cl.$^4$ .............................................. B32B 31/00
[52] U.S. Cl. .................................... 156/280; 29/25.35; 156/276; 156/305; 156/315; 156/331.1; 310/321; 310/348; 428/473.5
[58] Field of Search ..................... 156/280, 331.1, 276, 156/305; 310/321, 348; 252/514; 524/400; 29/25.35; 428/473.5; 156/315

[56] References Cited

U.S. PATENT DOCUMENTS 3,795,047  3/1974  Abolafia et al. .................... 156/276
4,263,702  4/1981  Vig et al. ............................ 29/25.35
4,266,157  5/1981  Peters ................................. 310/348

*Primary Examiner*—John J. Gallagher
*Attorney, Agent, or Firm*—Armand McMillan; Albert Sopp; Judson R. Hightower

[57] ABSTRACT

A method of bonding elements together with a bond of high strength and good electrical conductivity which comprises: applying an unfilled polyimide resin between surfaces of the elements to be bonded, heat treating said unfilled polyimide resin in stages between a temperature range of about 40° to 365° C. to form a strong adhesive bond between said elements, applying a metal-filled polyimide resin overcoat between said elements so as to provide electrical connection therebetween, and heat treating said metal-filled polyimide resin with substantially the same temperature profile as the unfilled polyimide resin. The present invention is also concerned with an adhesive, resilient, substantially void free bonding combination for providing a high strength, electrically conductive adhesive attachment between electrically conductive elements which comprises a major amount of an unfilled polyimide resin and a minor amount of a metal-filled polyimide resin.

16 Claims, 6 Drawing Figures

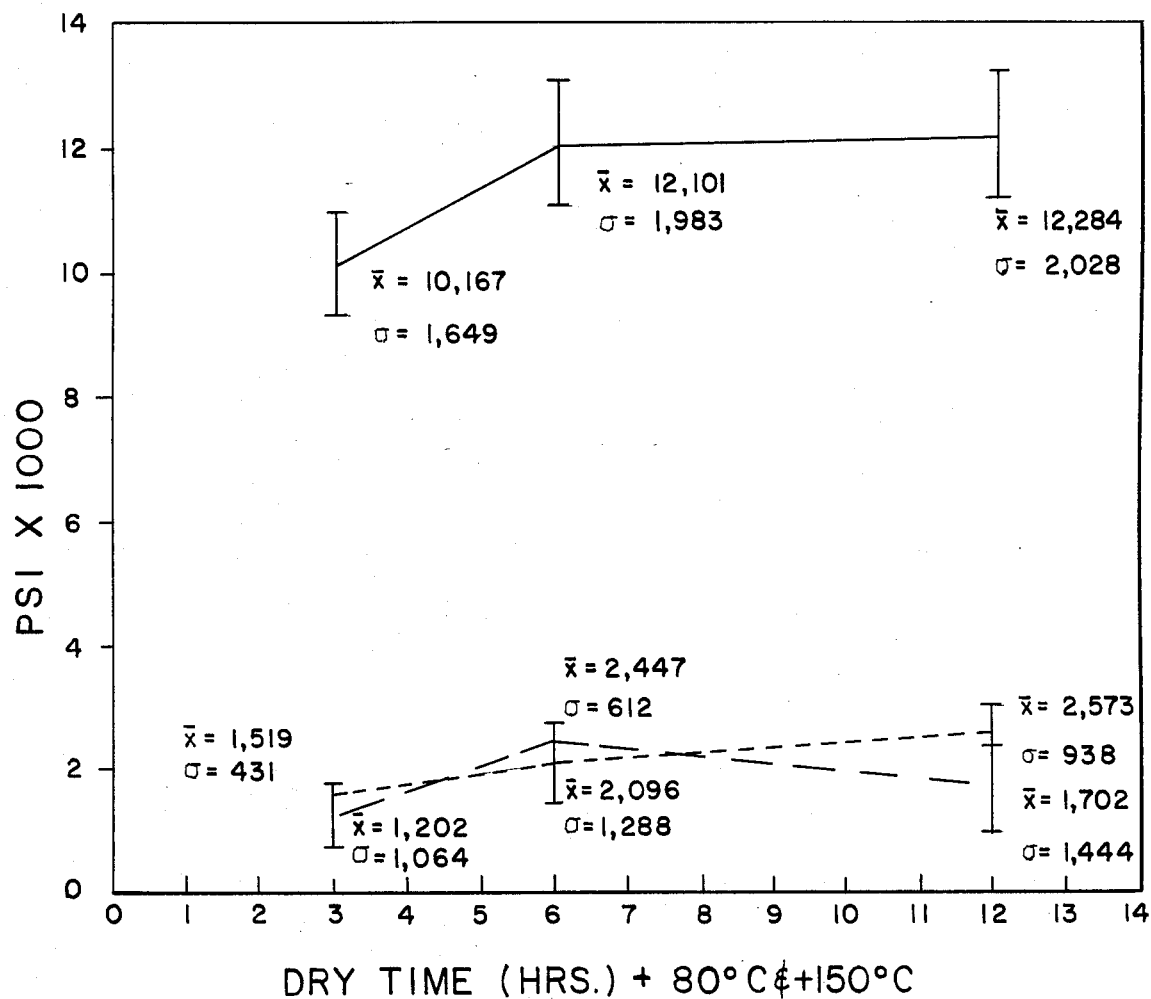

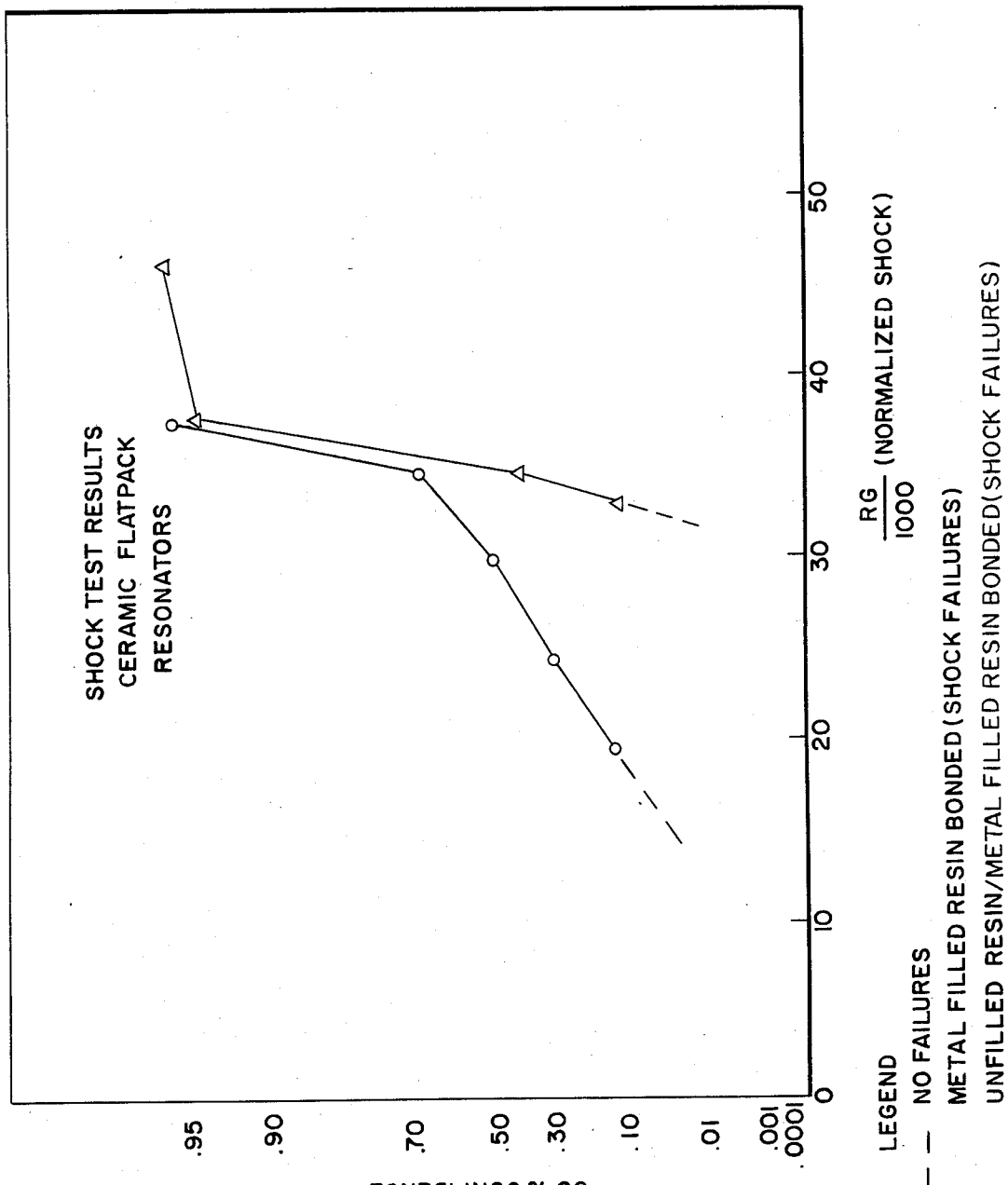

ELECTRICALLY CONDUCTIVE RESINOUS BOND AND METHOD OF MANUFACTURE

BACKGROUND OF THE INVENTION

Field of the Invention

The present invention relates to a new and improved electrically conductive resinous bond, its method of manufacture, and its use in the high temperature fabrication of electrical devices, e.g., the bonding of crystal blanks to mounting clips in crystal resonator fabrication, integrated circuit die bonding, tuning fork fabrication in electronic watches and the like. More specifically, the present invention is directed to a bonded article and method of manufacture utilizing an unfilled polyimide resin in combination with a conductive metal-filled polyimide resin, for providing a bond between elements, which is electrically conductive and exhibits a high resistance to shock and vibration. Advantageously, the bond of the present invention must operate effectively in high temperature and hard vacuum ($10^{-6}$ to $10^{-8}$) torr applications and must provide a bonded, void free, dense, resilient joint which, because of its resiliency, functions with less strain, and in the case of crystal resonators, provides a better long term crystal frequency stability.

A presently known technique for attaching a quartz crystal blank to a mounting structure (clips) employs the use of a silver-filled polyimide resin. The conductivity of the bond, which is essential to the operation of the crystal, is provided by the silver present in the bond. However, recent needs have created a demand for a conductive bond composition which possesses high shock and vibration resistance which exceeds the yield point of the bond strength of the known prior art materials by a considerable margin. The silver-filled polyimide resins referred to above do not possess the necessary resistance to vibration and shock. Gold-filled compositions have been investigated in this regard, but it has been found that they provide only about double the strength of the silver-filled polyimide resin and also have a low process reliability. Since gold is about twice the weight of silver, the gold-filled polyimide resin contains approximately 33% more polyimide than the silver-filled polyimide resin and this factor accounts for the increased strength.

U.S. Pat. No. 4,233,103 to Shaheen is directed to a high-temperature resistant, conductive adhesive composition for bonding a semiconductor die to a substrate which utilizes a mixture of a eutectic alloy of gallium-tin and gold and a polyimide resin. However, the metal matrix subsequently formed is structurally rigid and brittle, and when used in quartz resonators, could result in adverse effects with extremes of shock and temperature.

U.S. Pat. No. 4,284,461 to St. Clair et al discloses a method for preparing an aluminum ion-filled polyimide adhesive in which a meta-oriented aromatic diamine is reacted with an aromatic dianhydride and an aluminum compound in the presence of water or a lower alkanol miscible ether solvent to produce an intermediate polyamic acid. Thereafter, the polyamic acid is converted to the thermally stable, metal ion-filled polyimide by heating, and the result is a flexible, high-temperature adhesive. This adhesive, however, does not qualify as an electrically conductive adhesive when used alone because of the low metal content.

SUMMARY OF THE INVENTION

Accordingly, an object of the present invention is to provide an improved, electrically conductive bond, its method of manufacture and its use in the high temperature fabrication of electronic devices, for example, the bonding of a quartz crystal resonator blank to a mounting structure.

Another object of the present invention is to provide a void free, dense, resilient, electrically conductive, strong joint which functions effectively in high temperature and high vacuum applications.

A further object of the present invention is to provide a bonded structure which possesses good electrical conductivity and high resistance to shock and vibration.

Still another object of the present invention is to provide a bonded resonator assembly of improved strength while at the same time retaining the desired electrical properties.

Further scope of applicability of the present invention will become apparent from the detailed description given hereinafter. It should be understood, however, that the detailed description and specific examples, while indicating preferred embodiments of the present invention, are given by way of illustration only, since various changes and modifications within the spirit and scope of the invention will become apparent to those skilled in the art from the detailed description.

The present invention is directed to a new and improved electrically conductive bond, its method of manufacture and its use in bonding various types of structures together which requires the bond to possess the properties of high strength and good electrical conductivity. The present invention finds application in a number of bonding applications, such as the resonator bonding of crystals to mounting clips. Such high shock precision crystal resonators are used in weapon related applications for stable oscillators requiring high reliability. The electrically conductive bond of the present invention employs the use of a metal-filled polyimide resin and an unfilled polyimide resin. It has been found that by using a properly heat treated combination of a metal-filled polyimide which possesses good electrical conductivity and an unfilled polyimide which possesses great strength, a substantially void free, resilient, bonding joint can be produced which possesses both good electrical properties and a high magnitude of strength.

The metal-filled and unfilled polyimide resins which can be used in the present invention are well-known materials which are available from commercial sources. Any metal which is electrically conductive and is compatible with the polyimide resin can be used as the metal component of the metal-filled polyimide resin. Suitable metals include copper, nickel, chromium, cobalt, aluminum, and the noble metals, e.g., gold, silver, platinum, palladium, etc. and the like. The preferred metals are the noble metals, particularly silver and gold. A typical metal-filled polyimide is a silver-filled polyimide resin commercially known as Ablebond 71-1, which is made and marketed by Ablestik Laboratories. The uncured silver-filled resin typically contains about 62% by weight silver powder and about 38% by weight of the polyimide. The polyimide component has a solids portion of about 16% by weight and a solvent portion of about 22% by weight. The solvent portion comprises about 3.1% by weight methanol and about 18.9% by weight of N-methyl,2-pyrrolidone (NMP). The silver-filled resin has many applications in crystal resonator bonding because of its excellent conductivity. A typical gold-filled polyimide resin is commercially known as Ablebond 71-8, which is also marketed by Ablestik Laboratories. However, when the silver- or gold-filled polyimide resin is used in applications of severe vibration and shock, its strength has been found to possess serious limitations. According to the present invention, the strength limitation is eliminated by the use of an unfilled polyimide resin with the filled polyimide resin. The unfilled polyimide resin is commercially known as Ablestik 71-2, which is similarly made and marketed by Ablestik Laboratories. This polyimide resin has a solid portion of about 50% by weight and a solvent portion of about 50% by weight. The solvent portion also comprises about 7% methanol and about 43% NMP.

Typical polyimide adhesives which can be used in the present invention are prepared in the following condensation polyimide curing reaction:

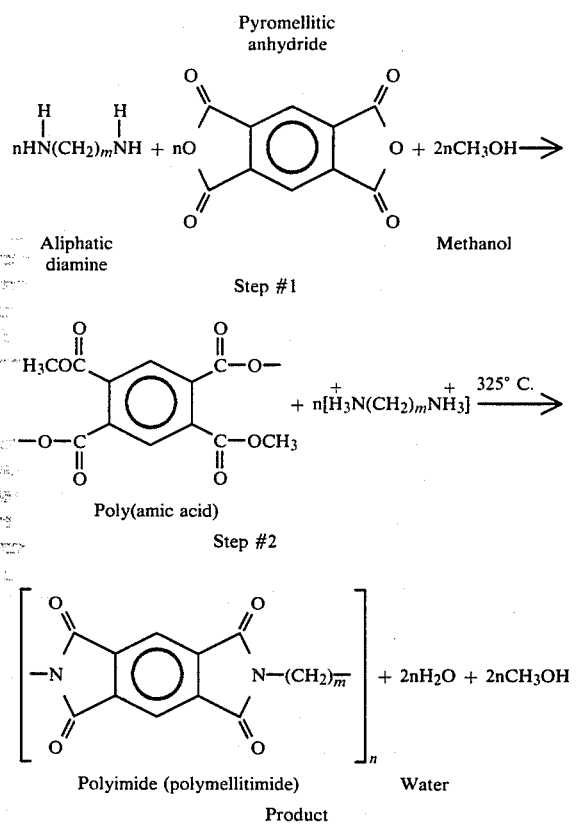

According to the present invention a crystal resonator blank bond of much higher strength and conductivity can be obtained when a metal-filled polyimide resin is used in combination with the unfilled polyimide resin. Advantageously, the bond utilizes a minor amount of the metal-filled polyimide resin and a major amount of the unfilled polyimide resin, preferably about 10 to 20 wt % of the metal-filled polyimide resin and about 80 to 90 wt % of the unfilled polyimide resin.

BRIEF DESCRIPTION OF THE DRAWINGS

The objects and many of the attendant advantages of the present invention will be readily appreciated as the same becomes better understood by reference to the following detailed description, when considered in conjunction with the accompanying drawings, in which like reference numerals designate like parts throughout the Figures thereof, and wherein:

FIG. 5 illustrates a comparison of the tensile strength of the components of the present invention; and FIG. 6 is a graph of the failure probability of resonator samples that were shock tested.

DETAILED DESCRIPTION OF THE INVENTION

Figure 1:
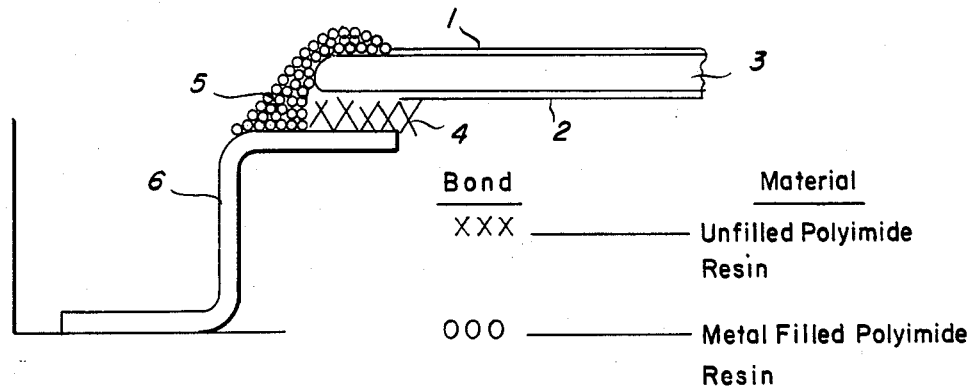
FIG. 1 depicts a resonator blank bonded to a mounting clip in accordance with one embodiment of the present invention.
Figure 2:
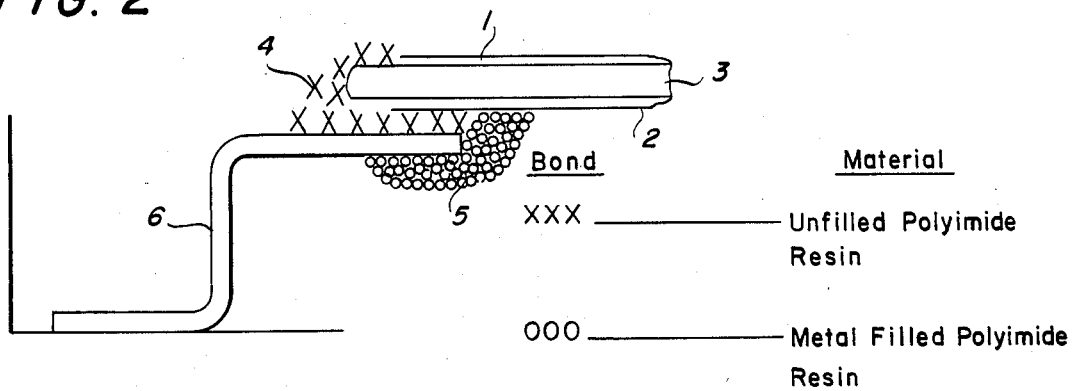
FIGS. 2 and 3 depict further embodiments of the present invention wherein the metal-filled and unfilled polyimide resins are applied in different configurations to achieve an effective bond between respective elements.
Figure 3:
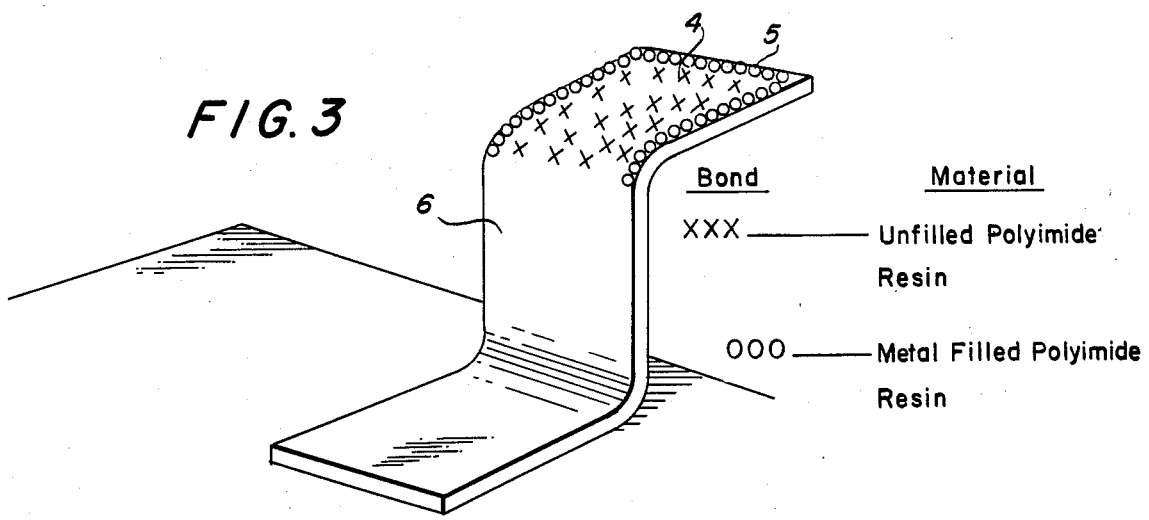

FIGS. 1 to 3 show several embodiments of how the metal-filled and unfilled polyimides can be applied to effect the bonding operation of the present invention. Thus, in FIG. 1 for example, the unfilled polyimide resin 4 is applied to each mounting area, i.e., over the top surface of each wire clip 6 from the tip position, back for about 20–30 mils. The viscosity will normally provide a coating thickness of about 3–5 mils. Next, the quartz wafer is oriented and placed so that the contact pads of the wafer are located over the mounting clip and the unfilled polyimide 4 dispersed on its surface. The unfilled polyimide 4 can be applied to slightly extend over the edge of the wafer to provide added strength to the joint. Before the metal-filled polyimide resin 5 is applied, the unfilled resin 4 is heat treated. The heat treating process for the unfilled polyimide resin 4 is conducted at about atmospheric pressure and in an atmosphere of dry nitrogen. The heat treating process is initiated at a temperature of about 40° C. and is gradually increased in stages over a period of time up to a temperature of about 365° C. in order to drive off undesirable residual matter from the resin and form a resilient, cured void free bond. A typical example of a temperature profile for heat treating the unfilled resin is given in the following Table.

TABLE I

| CENTIGRADE (°C.) | HOURS | REMARKS |
|---|---|---|
| about 40–80 | about ¾–1¼ | To Remove Absorbed Water |
| about 140–180 | about ¾–1¼ | To Remove Solvent |
| about 250–290 | about ½–2½ | To Complete Imidization (curing) |
| about 325–365 | about ¾–1¼ | To Remove Residual Organics, etc. |

When the heat treatment process for the unfilled resin 4 is complete, the metal-filled resin 5 is applied, for example as a thin film, to the cured joint so as to make continuous contact between the metallized contact pad areas on the quartz wafer and the clips. Once the metal-filled resin 5 has been applied, the same heat treating schedule as described hereinabove for the unfilled polyimide 4 is conducted for the metal-filled resin 5. There is about 2 to $3 \times 10^{-6}$ in³ total volume of pure polyimide and metal in each joint between the wafer and each of the clips, or about $10 \times 10^{-6}$ in³ in a completed package.

A particularly preferred stagewise temperature profile comprises heating at about 50° C. for about 1 hour to remove absorbed wafer, heating at about 150° C. for about 1 hour to remove the solvent, heating at about 275° C. for about 2 hours to complete imidization (curing) and heating at about 345° C. for about 1 hour to remove residual organic materials.

The embodiment of FIG. 1 depicts the technique of electrically connecting the "top" electrode 1 with the metal clip 6. The bottom electrode 2 must also be electrically connected to another clip so that the resonator blank 3 will function. FIG. 2 illustrates another means for providing electrical connection between the clip 6 and one of the electrodes, for example the bottom electrode of the resonator blank 3.

FIG. 3 depicts another arrangement for establishing both an electrical connection and a strong adhesive connection utilizing both the conductive metal-filled polyimide such as a silver-filled polyimide and an unfilled polyimide. As can be noted, the metal-filled polyimide 5 is disposed along the periphery of the clip and the unfilled polyimide 4 is disposed in the center of the clip.

EXAMPLES

The following Examples are given as being merely exemplary of the present invention and thus should not be considered as limiting the scope of the present invention.

Figure 4:
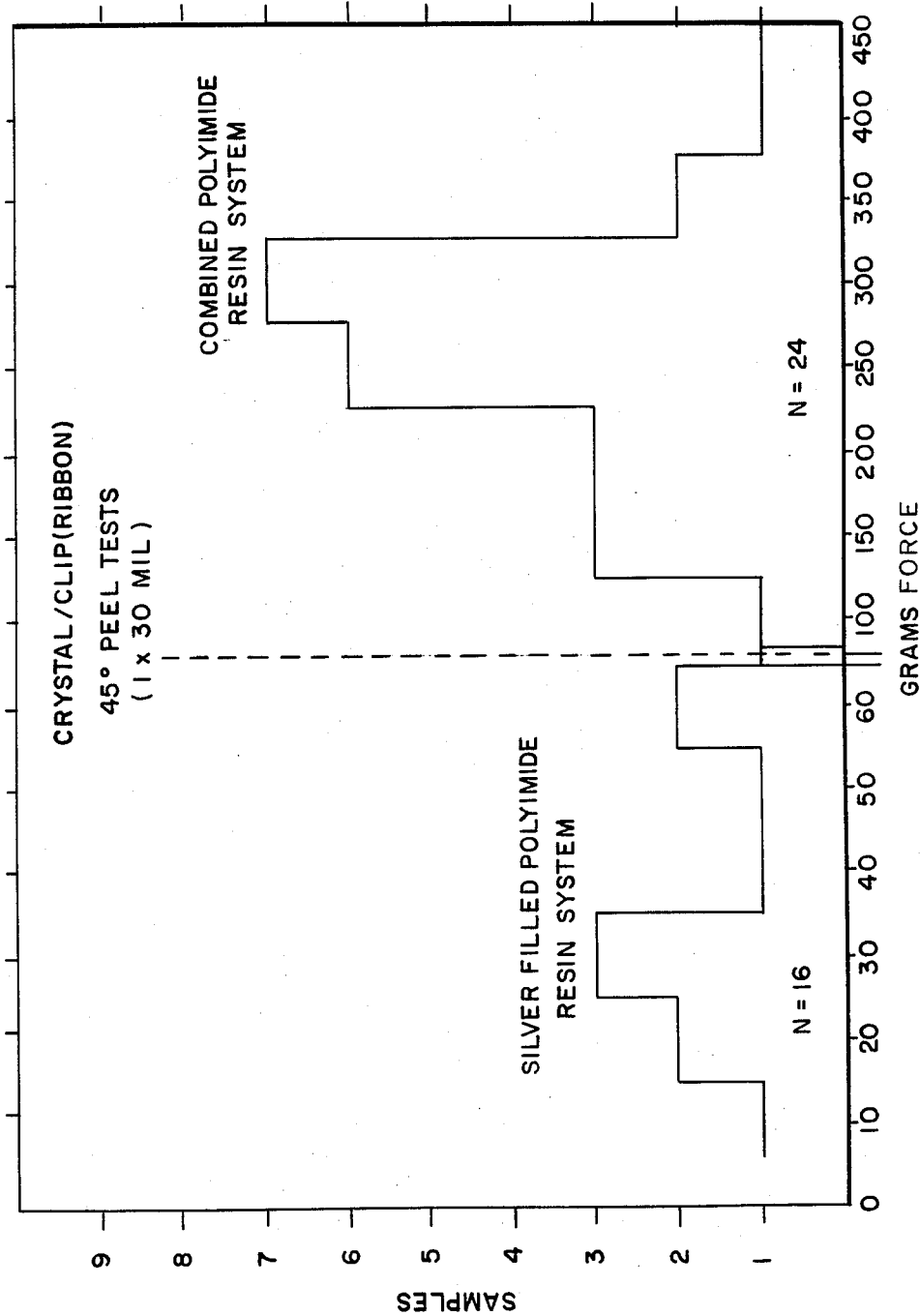
FIG. 4 illustrates the relative strength of the metal-filled polyimide bonding system and the unfilled polyimide bonding system.

Several resonator blanks and ribbon are bonded and tested using materials that represented actual resonator processes. One-half are bonded with a silver-filled polyimide resin and one-half are bonded with the combination of a silver-filled polyimide resin and an unfilled polyimide resin. The new process utilizes moly clips that are acid cleaned and a resin combination with longer curing times than the standard process which utilizes only the metal-filled resin. FIG. 4 illustrates the improved peel strength which is achieved by using the resin combination as compared to the use of only the silver-filled polyimide resin. Thus, the absissa represents the gram force required to pull or peel a crystal from a clip (ribbon) at a 45° angle, with the clip having a size of 1×30 mil. The ordinate represents the number of units or samples which failed at a given gram force.

Also, tensile strength tests using standard test specimens (an aluminum rod material 0.173" by 0.173") are performed to evaluate the bulk material strength of the resin joints of the present invention to determine the optimum strength for quartz resonators bonded to the mounting clips. Thus, the two aluminum rods are adhesively attached together and cured using as the adhesive a silver-filled polyimide resin, a gold-filled polyimide resin and an unfilled polyimide resin. The resin is cured in a nitrogen atmosphere and at ambient pressures of 2 hours at 275° C. and at 345° C. for 1 hour. FIG. 5 shows the results which are obtained. The improved tensile strength of the unfilled polyimide resin in psi is readily apparent when it is compared with the metal-filled polyimide resins. In FIG. 5, $\bar{x}$ represents the average strength and $\sigma$ represents the standard deviation from the measurement.

Ten silver-filled polyimide bonded resonators are shock tested to failure. The shock is applied in increasing levels through one axis, i.e., between the output tabs and the plane of the crystal. The range of failures is between 8,500G's to 12,350G's. On the other hand, six unfilled polyimide bonded resonators, utilizing silver-filled polyimide as an overcoat, are subjected to the same shock test procedure. The ribbon was gold plated in both sets of tests and the clips were at the 90° points around the perimeter of the crystal blank. The failure probability range of the six samples is between 13,850G's to 19,200G's. FIG. 6 represents a plot of the probability of failure for the samples tested. As can be seen, the combined use of both the metal-filled and unfilled polyimides shows a much higher reliability. The shock magnitudes are normalized for a 20 megahertz crystal.

The stepwise bonding process of the present invention is considered unique in the performance requirements of the ceramic flatpack enclosed quartz resonators for the following reasons: (1) the bond between the moly ribbon "clips" and the quartz crystal utilizes an unfilled polyimide resin for highest strength and toughness with flexibility and low stress in the joint, helping minimize long term crystal frequency perturbance from shock or temperature extremes. (2) The silver-filled polyimide resin "overcoat" is utilized primarily for electrical conduction. Since it can be applied in a thin layer, the joint is not embrittled, thus retaining toughness. Both the unfilled and filled polyimide resins have proven to be vacuum compatible, low in contamination, and have good high temperature (350° C.) properties in processing. The combination of these materials are nearly ideal for resonators (see Table II below). The ceramic flatback enclosure sealing process utilizes temperatures up to 350° C. for package bakeout and thermocompression lid sealing.

TABLE II

| | Comparison of Prior Art With the Present Invention New Bonding Method for Crystals | | | |
|---|---|---|---|---|
| Bonding Agent Performance Parameters | (Ideals) | Unfilled + Metal-filled Polyimide | (Ga—Sn + Au) Eutectic Polyimide (U.S. Pat. No. 4,233,103) | AL—Ion Extended Temp. Polyimide (U.S. Pat. No. 4,284,461) |
| 1. Elect. Conduct. | Must | Yes | Yes | No |
| 2. Low Out-Gassing | Must | Yes | Yes | Yes |
| 3. Low Contamination | Must | Yes | Yes | Yes |
| 4. Vacuum Compat. | Must | Yes | Yes | Yes |
| 5. In-Process Temp. 350° C. | Must | Yes | Yes | Yes |
| 6. Hi-Tensile Strength | Must | Yes | Yes | Yes |
| 7. Low Stress | Must | Yes | No | Yes |
| 8. High Toughness | Must | Yes | No | Yes |
| 9. Commercial Source | Want | Yes | No | No |
| 10. Single Stage Cure | Want | No | Yes | Yes |
| 11. End Use/Application | Want (Xtals) | Xtal, Integrated Chip Bonding | Integrated Chip Bonding | Aerospace Structure Bonding |
| Conclusions: | Best | Good* | Fair** | Poor*** |

*Longer processing times
**Problems with high shock Stress/strain effects on long term frequency stability
***Not electrically conductive The bonded articles of the present invention produced by the stepwise heat curing process described herein provides a bonded joint which possesses up to about 5 times the strength of the prior art bonded devices. Also the bonding materials are particularly effective in the fabrication of resonators where process temperatures must exceed 300° C. during package sealing.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of bonding elements together with a bond of high strength and good electrical conductivity, which comprises:
   applying an unfilled polyimide resin on a surface of each element to be bonded;
   bringing and holding said surfaces together;
   heat treating said unfilled polyimide resin in stages over a temperature range of about 40° to 365° C. to form a strong adhesive bond between said element surfaces;
   applying metal-filled polyimide resin over an exposed edge of said heat treated resin layer and in contact with an unbonded area of each bonded element, said metal-filled resin constituting a separate layer from said unfilled resin layer and forming an electrical connection between said bonded elements; and
   heat treating said metal-filled polyimide resin at the same temperature range profile as the unfilled polyimide resin.

2. The method as recited in claim 1, wherein the metal-filled polyimide resin is selected from the group consisting of a silver-filled polyimide resin, a good-filled polyimide resin, or a mixture thereof.

3. The method as recited in claim 1, wherein the metal-filled resin is applied so as to contact the top surface of one of the elements and the top surface of the other element.

4. The method as recited in claim 1, wherein the metal-filled polyimide resin is applied so as to contact the bottom surface of one element and the bottom surface of the other element.

5. The method as recited in claim 1, wherein one of the elements to be bonded is a crystal blank and the other element is a resonator clip.

6. The method as recited in claim 1, wherein the metal-filled polyimide resin is provided along the peripheral surfaces of the elements to be bonded together and the unfilled polyimide is disposed internal to said metal-filled polyimide resin.

7. The method as recited in claim 1, wherein said heat treating comprises:
   heating the unfilled polyimide resin in a first stage at a temperature of about 40° to 80° C. for about ¾ to 1¼ hours to remove absorbed water;
   heating said resin in a second stage at a temperature of about 140° to 180° C. for about ¾ to 1¼ hours to remove solvent;
   heating said resin in a third stage at a temperature of about 250° to 390° C. for about 1¾ to 2¼ hours to complete imidization;
   heating said resin in a fourth stage at a temperature of about 325° to 365° C. for about ¾ to 1¼ hours to remove residual organics; and
   substantially repeating the same heat treatment profile for the metal-filled polyimide resin.

8. The method as recited in claim 7, wherein the heat treatments of the metal-filled and unfilled polyimide resins are conducted at the following stages:
   Stage 1 at about 50° C. for about 1 hour;
   Stage 2 at about 150° C. for about 1 hour;
   Stage 3 at about 275° C. for about 2 hours; and
   Stage 4 at about 345° C. for about 1 hour.

9. The process as recited in claim 7, wherein the heat treatment process is conducted at atmospheric pressure and in an atmosphere of dry nitrogen.

10. An adhesive, resilient, substantially void-free bonding combination for providing a high strength, electrically conductive adhesive attachment between electrically conductive elements, which comprises a major quantity of unfilled polyimide resin in the form of a layer-between the elements bonded and a minor quantity of a metal-filled polyimide resin further joining said elements, said metal-filled resin being in contact with an edge of said unfilled resin layer and forming a separate layer from said unfilled resin layer.

11. The bonding combination as recited in claim 10, wherein the metal-filled polyimide resin is a silver-filled or gold-filled polyimide resin.

12. The bonding combination as recited in claim 10, wherein the metal-filled polyimide resin is a mixture of a gold-filled polyimide resin and a silver-filled polyimide resin.

13. The bonding combination of claim 10, comprising about 80 to 90 weight % of the unfilled polyimide resin and about 10 to 20 weight % of the metal-filled polyimide resin.

14. A quartz crystal bonded to a mounting structure with a bonding assembly comprising a layer of unfilled polyimide resin between said crystal and said structure and, in contact with said unfilled resin layer and with said crystal and mounting structure, a separate layer of metal-filled polyimide resin, said unfilled resin constituting about 80 to 90% and said filled resin about 10 to 20% of the total weight of resin in the assembly, said bonding assembly providing a void-free, resilient, electrically conductive and strong bond between the quartz crystal and the mounting structure.

15. The quartz crystal bonded to a mounting structure as recited in claim 14, wherein the mounting structure is a resonator clip.

16. The quartz crystal bonded to a mounting structure as recited in claim 14, wherein the metal-filled polyimide resin is a silver-filled polyimide resin, gold-filled polyimide resin, or a mixture thereof.

* * * * *